United States Patent [19]

Burt et al.

[11] Patent Number: 4,843,339
[45] Date of Patent: Jun. 27, 1989

[54] ISOLATION AMPLIFIER INCLUDING PRECISION VOLTAGE-TO-DUTY-CYCLE CONVERTER AND LOW RIPPLE, HIGH BANDWIDTH CHARGE BALANCE DEMODULATOR

[75] Inventors: Rodney T. Burt; Robert M. Stitt, II, both of Tucson, Ariz.

[73] Assignee: Burr-Brown Corporation, Tucson, Ariz.

[21] Appl. No.: 114,654

[22] Filed: Oct. 28, 1987

[51] Int. Cl.[4] ............................................. H03F 3/38
[52] U.S. Cl. .................................... 330/10; 328/151; 437/60; 437/226
[58] Field of Search ..................... 330/10, 251, 207 A, 330/307; 307/353; 328/151; 332/9 R, 9 T; 375/22, 94; 329/104, 106; 437/60, 226, 918

[56] References Cited

U.S. PATENT DOCUMENTS

| | | | |
|---|---|---|---|
| 3,441,877 | 4/1969 | Thompson | 375/22 Y |
| 3,596,191 | 7/1971 | Stuckert | 307/353 V |
| 3,636,458 | 1/1972 | Sugiyama et al. | 328/151 |
| 3,740,586 | 6/1973 | Banks et al. | 307/229 |
| 3,936,674 | 2/1976 | Hughes | 307/233 |
| 3,982,193 | 9/1976 | Maringer | 328/151 |
| 4,156,923 | 5/1979 | Lampe et al. | 307/353 V |
| 4,166,248 | 8/1979 | Bianchi et al. | 328/140 |
| 4,249,136 | 2/1981 | Suzuki et al. | 330/10 X |
| 4,408,166 | 10/1983 | Moeller | 329/106 |
| 4,415,863 | 11/1983 | Tokumo | 330/10 |
| 4,504,793 | 3/1985 | Yokoyama | 330/10 |
| 4,588,954 | 5/1986 | Seymour | 328/151 |

FOREIGN PATENT DOCUMENTS 2157519 10/1985 United Kingdom ................ 307/353

OTHER PUBLICATIONS

Klynin, "Direct-Current Amplifier with Frequency-pulse-width modulation", Instrum. & Exp. Tech. (U.S.A.) vol. 19, No. 5, Sep.-Oct. 1976 pp. 1415-1417.

Primary Examiner—James B. Mullins
Attorney, Agent, or Firm—Cahill, Sutton & Thomas

[57] ABSTRACT

An isolation amplifier includes a voltage-to-duty-cycle modulator, a non-galvanic isolation barrier, and a demodulator converting a duty-cycle-modulated signal transmitted across the isolation barrier to an analog voltage replica of the analog input voltage. The modulator circuit includes a first current switching means which produces a first current that is switched between positive and negative values in response to an output from a comparator that can be referenced to a noise-synchronized signal. The first current is summed with an input current and the difference is integrated and input to the comparator, the output of which produces the duty-cycle-modulated signal. The demodulator includes a second current switching circuit for producing a second current that is switched between positive and negative levels in response to the duty-cycle-modulated signal received across the isolation barrier and includes circuitry for algebraically summing the input current with the second current and integrating the result to produce the analog output voltage. The modulator circuit and demodulator circuits are fabricated on a single semiconductor area to produce the close matching between components of the first and second current switching circuits. The area is cut in half to produce two chips, which are connected to two isolation barrier capacitors. In the demodulator, a sample and hold circuit synchronized with the duty-cycle-modulated signal transmitted across the isolation barrier samples the output of the integrator.

38 Claims, 6 Drawing Sheets

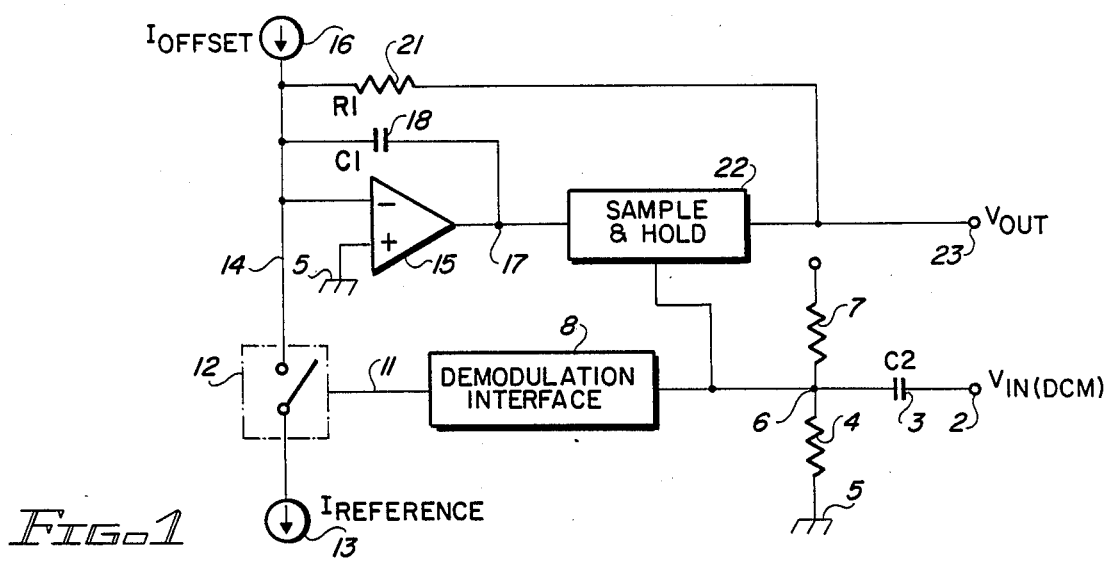
_Fig-1_
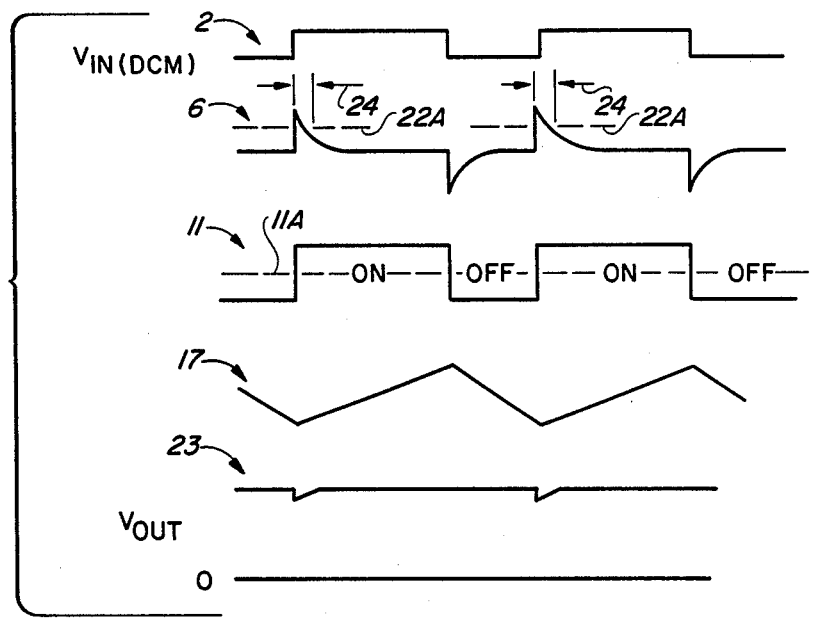
_Fig-2_
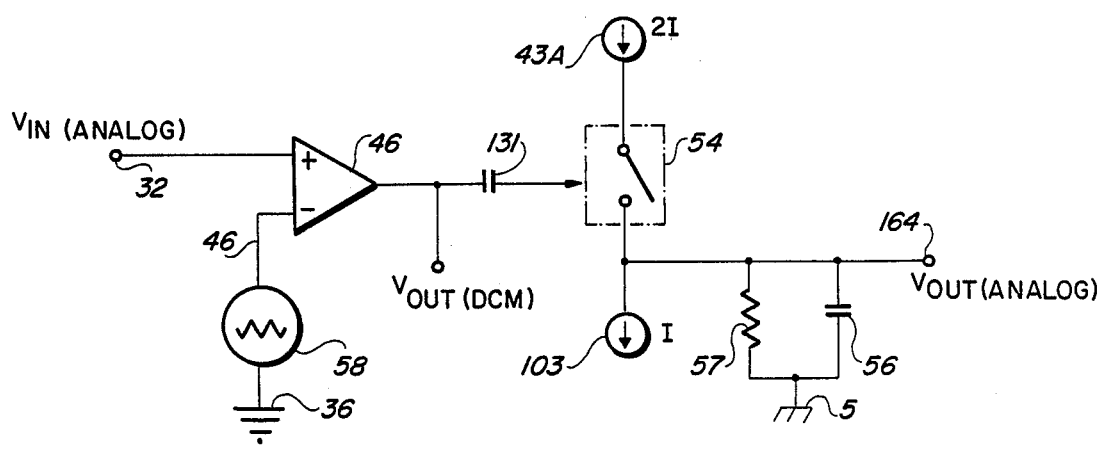
_Fig-3_
(PRIOR ART)

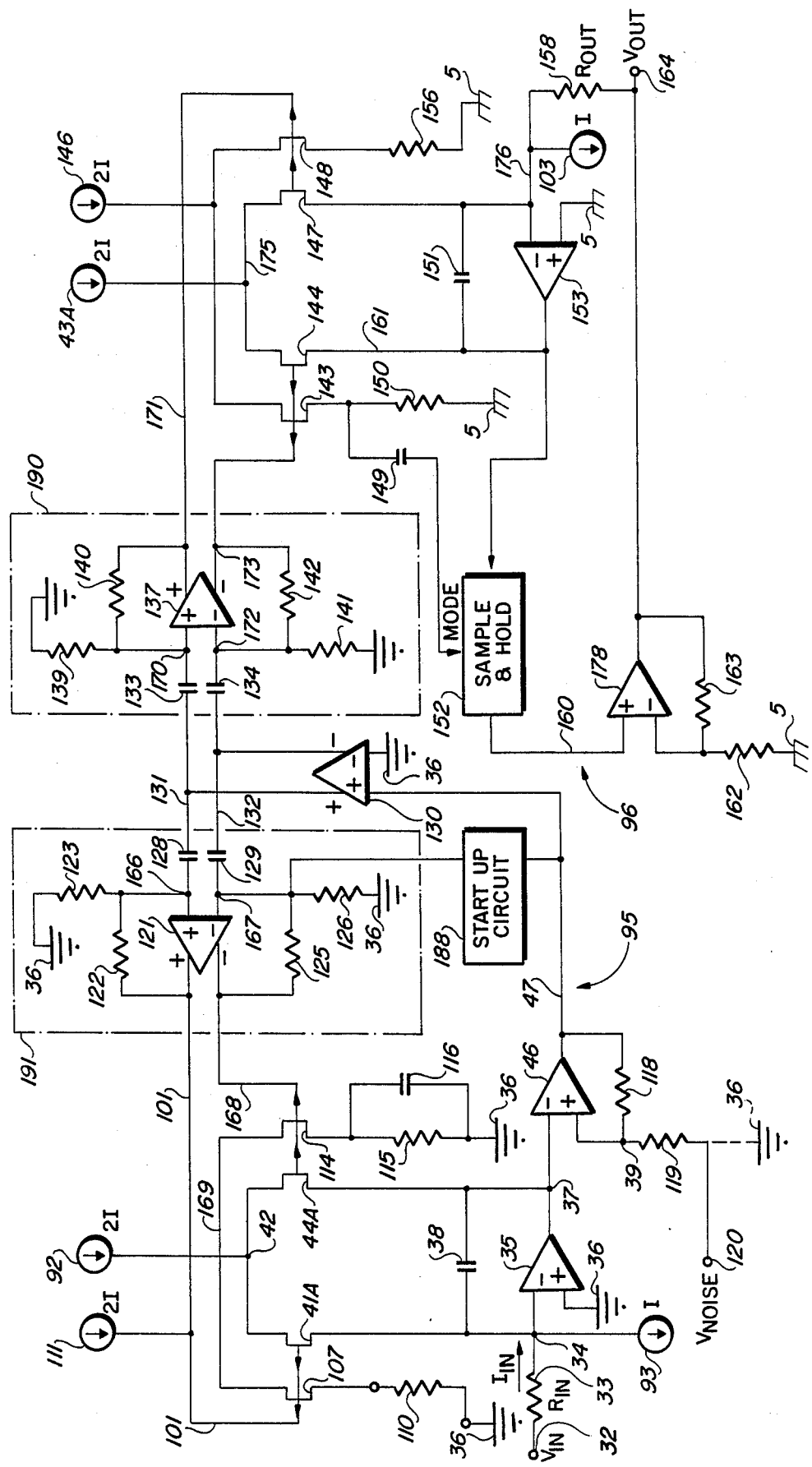

ISOLATION AMPLIFIER INCLUDING PRECISION VOLTAGE-TO-DUTY-CYCLE CONVERTER AND LOW RIPPLE, HIGH BANDWIDTH CHARGE BALANCE DEMODULATOR

BACKGROUND OF THE INVENTION

The invention relates to isolation amplifiers and to modulation and demodulation techniques that may be useful in isolation amplifiers, including circuitry for converting voltage-to-frequency, phase, or pulse width representations thereof, and to circuitry for converting such representations back to a voltage or current signal representative of the original analog voltatge, and also including a high precision voltage-to-duty-cycle conversion technique and a low ripple, high bandwidth technique for converting such representations back to an analog signal representative of the original input voltage.

Voltage-to-duty-cycle conversion techniques and voltage-to-frequency conversion techniques are commonly used in various applications. Recovery of an analog input voltage is frequently accomplished by duty-cycle-to-voltage demodulators or frequency-to-voltage demoldulators. Examples of common applications of such circuits include switching power supplies, DC-to-DC converters, and isolation amplifiers. In the prior art, precision voltage-to-duty-cycle conversion has been preformed by comparing a linear triangular waveform voltage to an analog input voltage level, producing a "1" level when the triangular waveform voltage exceeds the analog input voltage, and producing a "0" level when the triangular waveform voltage is less than the analog input voltage. As the analog input voltage is increased, the duty cycle of the digital output waveform is decreased proportionally. The accuracy of the voltage-to-duty-cycle transfer function depends greatly upon the linearity of the triangular waveform and on the accuracy of the comparator used, and some of the information contained in the analog input voltage is lost. Also, the accuracy of such prior voltage-to-duty cycle conversion circuits is subject to input offset errors, i.e., errors in the relationship between a zero value of the analog input voltage and the corresponding 50 percent duty cycle of the duty-cycle-modulated (DCM) digital output waveform.

Charge balanced demodulators of the type that perform frequency-to-voltage conversion or duty-cycle-to-voltage conversion are well known. Such circuits receive a frequency modulated or duty-cycle encoded input pulse signal. This signal typically is applied to a high pass filter and applied to the input of a suitable demodulation interface circuit, which can be a one-shot circuit for a frequency-to-voltage converter or an edge triggered latch circuit for a duty-cycle-to-voltage converter. The output of the demodulation interface circuit controls a switch that couples a constant reference current to the inverting input of an operational amplifier, the non-inverting input of which is connected to ground. The output of the operational amplifier is connected through an integrating circuit including an integrating feedback capacitor and a parallel feedback resistor to the inverting input. The average current through the feedback capacitor must be zero, and the output voltage of the operational amplifier assumes a value necessary to cause the inverting input to be at a virtual ground voltage. The transfer characteristic of the output voltage to the modulated input signal frequency or dutycycle is very accurate, but the output voltage contains a large amount of ripple voltage. Although the amount of ripple voltage can be decreased by increasing the feedback capacitance, the bandwidth also is decreased. The trade-off between the bandwidth and ripple voltage is a significant limitation in many systems, such as in servo loops, wherein the ripple must be low but low bandwidth may cause loop instability.

Previous techniques used to minimize ripple voltage without affecting bandwidth have been less than satisfactory because they limit the range of carrier frequencies at which the demodulator can operate and/or they limit the accuracy of the transfer characteristic. For example, using a low pass filter in series with an output is not effective if a large operating frequency range is required. Furthermore, such filters are expensive. Another technique is to use the charge balanced demodulator as a feedback component in a phase locked loop, but this technique suffers from lack of versatility and is complex and expensive. Another technique has been to utilize a sample and hold circuit at the demodulator output and sample the output at a specific time during the demodulation cycle. This technique often adds greater error to the circuitry than already existed due to offsets and sample timing errors in the sample and hold circuit.

Isolation amplifiers are a common application of voltage-to-duty-cycle conversion circuits and charge balanced demodulators. The analog input voltage is converted to a digital signal, the duty-cycle of which represents the amplitude of the analog input voltage. This digital signal can be accurately transmitted over a standard isolation barrier, such as an optically coupled device or a transformer. After transmission over the isolation barrier, the input voltage signal is reconstructed by a duty-cycle to voltage demodulator. The accuracy of such isolation amplifiers has been limited by the above-mentioned inaccuracies of prior voltage-to-duty-cycle converters and prior charge balanced demodulators.

The state-of-the-art is such that there remains a substantial need for improved voltage-to-duty-cycle converters having higher accuracy than previously achievable and for charge balanced demodulators that are inexpensive, and also having higher speed, higher bandwidth, and lower ripple voltage than prior voltage-to-duty-cycle converters.

A problem of demodulators in circuits such as isolation amplifiers is that noise signals may be close to the modulator/demodulator carrier signal frequency. If this is the case, the modulator produces a difference signal of relatively low frequency, the carrier signal itself, and a sum signal having the frequency equal to the sum of the noise signal and the carrier signal. Ordinarily, it is quite easy to filter out the carrier signal and the sum signal, but difficult to filter out the difference signal (because its frequency is low) without also filtering the desired low frequency modulation signal.

Therefore, it would be desirable to provide an improved modulator and demodulator system that avoids the need to filter out noise difference signals produced by a modulator. It also would be desirable to provide an improved modulator and demodulator system which can function as a sharp filter for noise signals of known frequencies.

Another problem with prior isolation amplifiers is the difficulty of achieving a precise, transfer function that is relatively independent of temperature and variations in processing parameters.

SUMMARY OF THE INVENTION

It is an object of the invention to provide a voltage-to-duty-cycle conversion circuit and technique that is more accurate than the closest prior art devices.

It is another object of the invention to provide a voltage-to-duty-cycle converter circuit that is accurate despite non-linearities in a triangular waveform input voltage thereto.

It is another object of the invention to provide a charge balanced demodulator which has low ripple and high bandwidth without degrading the accuracy of the transfer characteristic.

It is another object of the invention to provide such a charge balanced demodulator with simple, inexpensive circuitry.

It is another object of the invention to provide a low cost, high performance isolation amplifier capable of undergoing very large, rapid changes in the difference between ground voltages on opposite sides of the isolation barrier without loss of information or data than is the case for the closest prior art isolation amplifiers.

It is another object of the invention to provide an isolation amplifier that avoids the need to filter out low frequency noise difference signals.

Briefly described, and in accordance with one embodiment thereof, the invention provides a modulator-to-modulator system including a modulator circuit including a first current switching circuit for producing a first current that is switched between positive and negative values in response to a duty-cycle-modulated signal produced by the modulator circuit in response to an analog input voltage, an isolation barrier for transmitting the duty-cycle-modulated signal to a demodulator circuit included in the isolation amplifier, the demodulator circuit including a second current switching circuit for producing a second current that is switched between positive and negative values in response to the duty-cycle-modulated signal transmitted across the isolation barrier. In one described embodiment of the invention, the demodulator is a charge balanced demodulator wherein a sample and hold circuit has an analog input coupled to an output of an integrating circuit that integrates the second current to produce an output of the sample and hold circuit and an analog output voltage that is accurately representative of the analog input voltage. The analog output voltage is coupled by a feedback resistor to the input of an operational amplifier included in the integrating circuit. A charge balance capacitor of the integrating circuit is connected between the output of the operational amplifier and an input thereof. In a described embodiment of the invention, the first and second current switching circuits are precisely matched to produce the same ratios of positive to negative values in response to the duty-cycle-modulated signal. Both the demodulator circuit and modulator circuit are fabricated on separate portions of a single large semiconductor chip, and trimmable components are precisely trimmed to produce the precise matching. The semiconductor chip then is cut into separate pieces to provide a modulator chip and a demodulator chip which are packaged in a single package and connected to terminals of small capacitors which constitute the isolation barrier. In one described embodiment, the modulator includes an integrating circuit which integrates the algebraic sum of the input current and the first current. The output of that integrating circuit is applied to one input of a hysteresis comparator, the output of which drives the first current switching circuit. A signal synchronized to a known noise signal is applied to the other input of the hysteresis comparator, causing the modulator carrier frequency to be synchronized to the noise signal. This prevents the modulator from generating a low frequency beat signal that would be difficult to filter. In another embodiment, the sample and hold circuit is implemented by a "bucket brigade" sample and hold circuit which includes two sample and hold circuits cascaded together to further reduce voltage ripple in the analog output voltage.

BRIEF DESCRIPTION OF THE DRAWINGS

FIG. 1 is a circuit diagram of a charge balanced demodulator of the present invention.

FIG. 2 is a timing diagram useful in explaining the operation of the charge balance demodulator of FIG. 1.

FIG. 3 is a circuit diagram of a prior art isolation amplifier utilizing a voltage-to-duty-cycle modulator and a duty-cycle-to-voltage demodulator.

FIG. 5 is a detailed schematic circuit diagram of the isolation amplifier of FIG. 4D.

DESCRIPTION OF THE PREFERRED EMBODIMENTS OF THE INVENTION

Figure 4A:
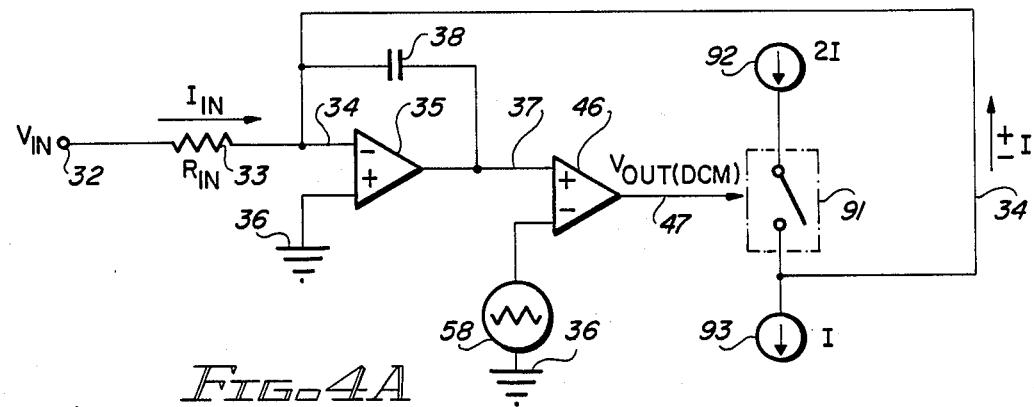
FIG. 4A is a block diagram of a voltage-to-duty-cycle modulator with switched positive and negative current feedback and including a free-running oscillator.

Referring now to FIG. 1, charge balanced demodulator circuit 1 receives digital input voltage $V_{IN}$ on conductor 2, which is connected to one terminal of a capacitor 3. The other terminal of capacitor 3 is connected by conductor 6 to one terminal of resistor 4, the other terminal of which is connected to demodulator ground conductor 5 and to one terminal of resistor 7, the other terminal of which is connected to a positive power supply voltage $+V$. Conductor 6 is also connected to a sample control input of a sample and hold circuit 22 and a demodulation interface circuit 8. Demodulation interface circuit 8 can include an edge triggered flip-flop for turning switch 12 on in response to a positive pulse and turning switch 12 off in response to a negative pulse to achieve duty-cycle-to-voltage conversion. The output of demodulation interface circuit 8 is connected by a conductor 11 to the control input of a switch 12, which can be a JFET (junction field effect transistor). The current carrying terminals of switch 12 are connected to a constant reference current source 13, which produces a reference current $I_{REFERENCE}$. The other current carrying terminal of switch 12 is connected by conductor 14 to the inverting input of an operational amplifier 15. The non-inverting of amplifier 15 is connected to ground conductor 5. Conductor 14 is also connected to a second constant current source 16, through which a constant offset current $I_{OFFSET}$ flows. The output 17 of amplifier 15 is connected to one terminal of charge balance capacitor 18, the other terminal of which is connected to conductor 14. Conductor 17 also is connected to the analog voltage input of sample and hold circuit 22, the output of which is connected to conductor 23, on which an output voltage $V_{OUT}$ is produced. A feedback resistor 21 having a resistance R1 is connected between conductors 14 and 23.

Referring now to FIG. 2, $V_{IN(DCM)}$ waveform 2 is a duty-cycle-modulated voltage that represents an analog input signal. The positive-going edges of $V_{IN(DCM)}$ cause a differentiating circuit or high pass filter including capacitor 3 and resistors 4 and 7 to produce waveform 6 on conductor 6. (A one-shot circuit could be used in place of the circuit 3, 4, 7.) In waveform 6, dotted line 22A designates the sample threshold voltage of sample and hold circuit 22. Demodulation interface circuit 8 responds to the positive-going edges of the positive spikes in waveform 6 to turn switch 12 on, as indicated by node 11. The negative-going edges of the negative pulses of waveform 6 turn off switch 12. The sample time 24 is determined by the times that the positive-going edges and negative-going edges of the positive pulses of waveform 6 cross the sample threshold voltage 22A.

When the voltage of conductor 6 is above the threshold level 22A, the output voltage $V_{OUT}$ on conductor 23 precisely tracks or follows the voltage produced on conductor 17 by the output of operational amplifier 15. When the voltage on conductor 6 then falls below sample threshold level 22A, the voltage $V_{OUT}$ on conductor 23 then is precisely held at its present value until the voltage of waveform 6 again exceeds sample threshold level 22A. Various circuits that are commercially available can perform this function. Or, a new sample and hold technique shown in FIGS. 7 and 8 can be used.

The duration of the sample time 24 is determined by the response of the high pass filter circuit 3, 4, 7 to the duty-cycle-modulated input $V_{IN(DCM)}$. The feedback loop from conductor 23 to conductor 14 through resistor 21 causes the current through resistor 21 to exactly equal the sum of $I_{OFFSET}$ and the average switched reference current $I_{REFERENCE}$. The value of $I_{OFFSET}$ can be varied to adjust $V_{OUT}$ without affecting the transfer function relating $V_{IN(DCM)}$ to $V_{OUT}$. With the charge balance of capacitor 18 preserved, and with the current through resistor 21 proportional only to $V_{OUT}$, the accuracy of demodulator 1 is independent of the accuracy of the sample and hold circuit 22, which merely alters the ripple characteristics of waveform 17. The sample time 24 is determined by the level of the sample threshold voltage 22A and the fall time of the high pass filter 3, 4, 7. The feedback loop including capacitor 18 and resistor 21 maintains conductor 14 at a virtual ground voltage that is equal to the voltage of demodulator ground conductor 5. Waveform 17 is a triangle waveform resulting from the charging and discharging of capacitor 18 with constant currents through resistor 21 and the difference current between $I_{OFFSET}$ and the switched $I_{REFERENCE}$ current, which depends on the state of switch 12. The value of $V_{OUT}$ shown by waveform 23 is the sample value of waveform 17 during the sample time 24 and is held constant at the last value occurring during the previous sample time 24. If droop of $V_{OUT}$ during the whole period is negligible, the ripple is reduced over that of waveform 17 by a factor of $$1/[2f \cdot (\text{sample time } 24)].$$

This circuit gives a ripple reduction of as much by a factor of 100 to 1000 over that achievable without the sample and hold circuit 22 connected as shown.

It should be noted that the charge balanced demodulator of FIG. 1 is not unconditionally stable, but it is unconditionally stable for all input frequencies above the critically compensated frequency of $1/R1 \cdot C1$, R1 and C1 being the capacitance of resistors 21 and 18, respectively. Practical phase modulated carriers usually will have a minimum frequency well above this value.

Referring next to FIG. 3, a basic prior art isolation amplifier is shown. The isolation amplifier includes a voltage-to-duty-cycle modulation circuit including a comparator 46 and a precision triangle waveform generator 58 connected between modulator ground conductor 36 and an inverting input of comparator 46. An analog input voltage $V_{IN}$ is applied by conductor 32 to the non-inverting input of comparator 46. The output of comparator 46 is connected to one terminal of an isolation barrier capacitor 133 or other means of signal coupling, the other terminal of which is connected to the input of a switching circuit 54. Switching circuit 54 couples a "2I current source" 43A to a current source 103 that produces a constant current flow I. The circuitry 43A, 54, 103 is referred to as an "I-2I current switch" which, depending upon the state of the current switch 54, causes a positive or negative current I to flow into or out of conductor 164.

An integrating circuit includes resistor 57 connected between conductor 164 and demodulator ground conductor 5, and a capacitor 56 connected between conductor 164 and ground conductor 5. This integrating circuit integrates the duty-cycle-modulated signal that is produced at the output of comparator 46 and transmitted across the isolation barrier capacitor 133. Thus, the I-2I current switch 54 in combination with the integrating circuit 56, 57 forms a duty-cycle-to-voltage demodulator. The output ripple voltage component of $V_{OUT}$ can be decreased by increasing the capacitance of capacitor 56, but the isolation amplifier bandwidth is correspondingly reduced. The linearity of this isolation amplifier relies directly on the linearity of the triangle waveform of generator 58.

In accordance with the present invention, the duty cycle modulation circuit contained in FIG. 4A includes a feedback loop that connects the output of comparator 46 by means of conductor 47, I-2I current switch 91, 92, 93, and conductor 34 to the inverting input of an operational amplifier 35. The output conductor 37 of operational amplifier 35 is connected by a feedback capacitor 38 to conductor 34. Conductor 34 also is connected by an input resistor 33 having a resistance $R_{IN}$ to input conductor 32, to which the analog voltage $V_{IN}$ is applied, causing an input current $I_{IN}$ equal to $V_{IN}/R_{IN}$ to flow through resistor 33. The modulator ground conductor 36 is connected to the non-inverting input of perational amplifier 35. Amplifier output conductor 37 is connected to the non-inverting input of comparator 46.

This circuit operates by summing either $+I$ or $-I$ with $I_{IN}$ at conductor 34. This causes the integrator including resistor 33, operational amplifier 35, and capacitor 38 to vary the "threshold" voltage applied by conductor 37 to the non-inverting input of comparator 46 to thereby vary the threshold of comparator 46 to whatever value is needed to cause the duty-cycle-modulated signal $V_{OUT\,(DCM)}$ on conductor 47 to produce an average value $+I$ and $-I$ currents fed back to node 34 to be equal to $V_{IN}$. The advantage of this mode of operation is that the duty-cycle modulator signal produced on conductor 47 is essentially independent of the linearity of the free-running oscillator circuit 58. The duty-cycle-modulated signal produced on conductor 47 accurately represents the analog input voltage $V_{IN}$ regardless of whether free-running oscillator 58 produces a precise, linear triangular waveform or even, for example, a sinusoidal waveform.

Figure 4B:
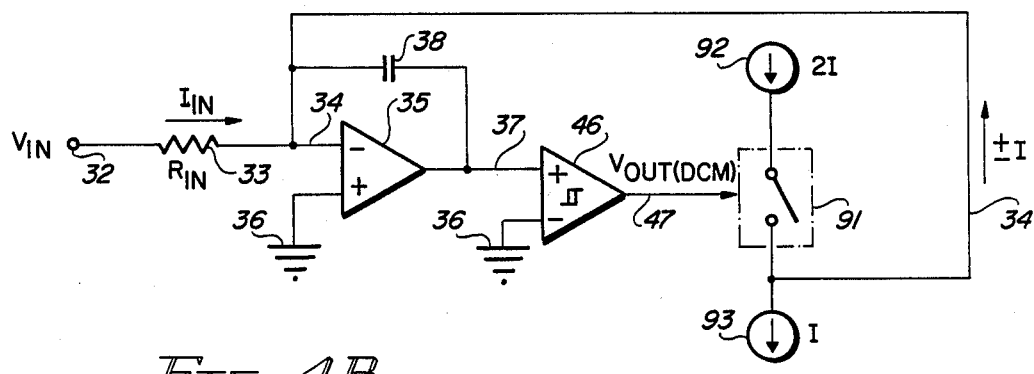
FIG. 4B is a voltage-to-duty-cycle modulator with switched positive and negative current feedback and a hysteresis comparator that establishes an internal oscillation frequency.

FIG. 4B shows a variation of the circuit shown in FIG. 4A in which the free-running oscillator 58 has been eliminated, and comparator 46 is designed with hysteresis. In this circuit, the inverting input of hysteresis comparator 46 is connected to modulator ground conductor 36. The amount of ripple voltage of the integrator output on conductor 37 and the hysteresis voltage between the triggering levels of the non-inverting input of hysteresis comparator 46 are proportional to the frequency of oscillation.

Figure 4C:
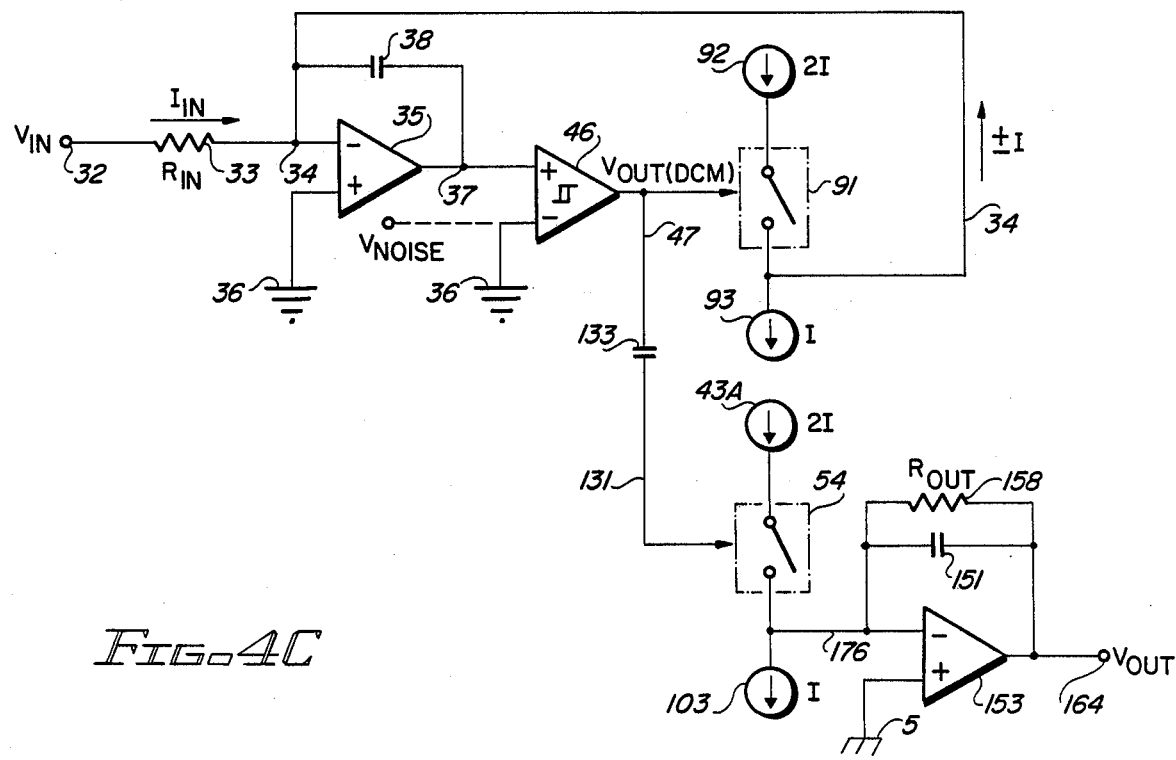
FIG. 4C is a block diagram of an isolation amplifier with voltage-to-duty-cycle modulation as in FIG. 4B and duty-cycle-to-voltage demodulation.

Referring to FIG. 4C, which shows an isolation amplifier, the duty-cycle-modulated output voltage produced on conductor 47 (by a modulator circuit like the one in FIG. 4B) is connected to one terminal of isolation capacitor 133, the other terminal 131 of which is connected to a duty-cycle-to-voltage converter, thereby producing an isolation amplifier. Operational amplifier 153 has its inverting input connected to conductor 176. Capacitor 151 and output resistor 158 are connected in parallel between conductors 164 and 176, so operational amplifier 153 functions as an integrator. The non-inverting input of operational amplifier 153 is connected to demodulator ground conductor 5. Current switches 91 and 54 are precisely matched. The ratio of "2I" current sources 92 and 43A is precisely matched to the ratio of and "I" current sources 93 and 103. The transfer function of the isolation amplifier of FIG. 4C is indicated in the equation $$V_{OUT} = (R_{OUT}/R_{IN})V_{IN}.$$

Figure 4D:
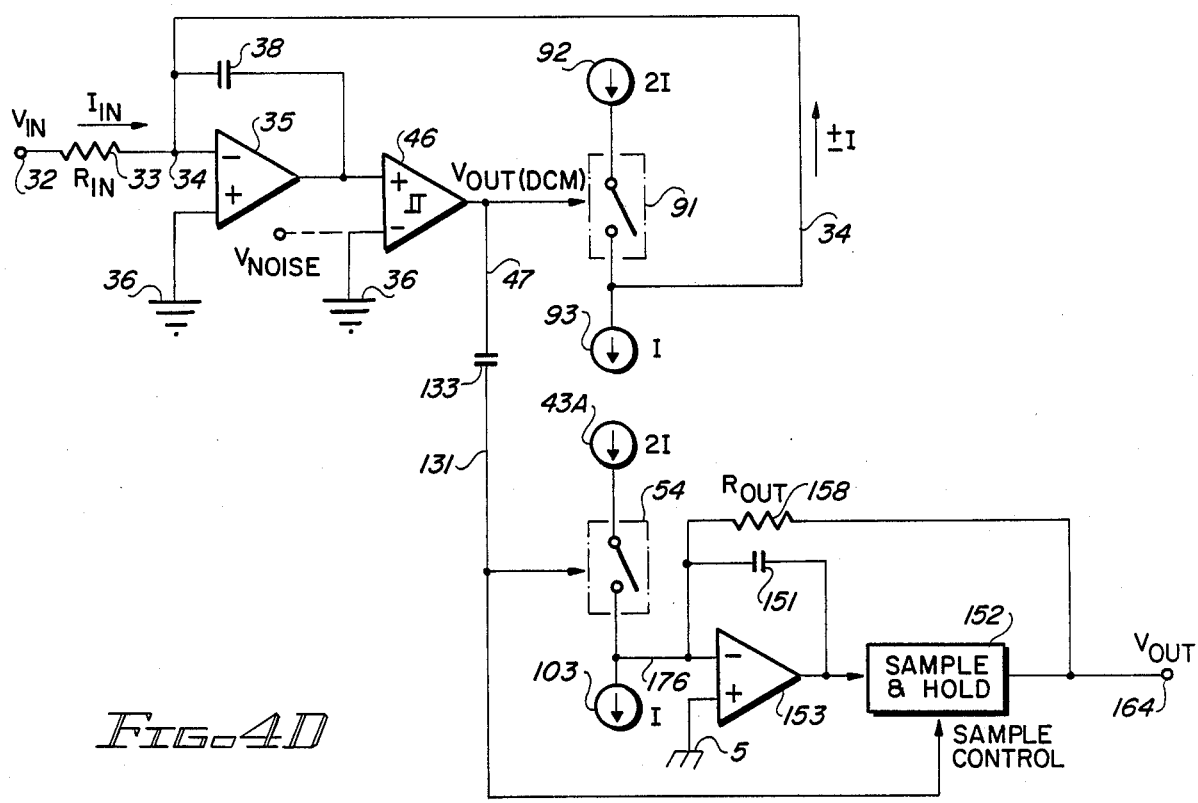
FIG. 4D is an isolation amplifier with voltage-to-duty-cycle modulation and a duty-cycle-to-voltage demodulator that includes a sample and hold circuit in an integrator feedback loop to reduce output voltage ripple.

The isolation amplifier of FIG. 4C has a ripple voltage equal to $$V_{RIPPLE} = V_{HYSTERESIS}(R_{OUT}/R_{IN})(C_{IN}/C_{OUT}),$$

where $V_{HYSTERESIS}$ is the difference between the trip points of hysteresis comparator 46. In order to eliminate most of this ripple voltage, the circuit shown in FIG. 4D is provided, including a sample and hold circuit 152 (as in FIG. 1) in the feedback loop between the output of integrator 153 and the inverting input thereof.

Referring to FIG. 5, isolation amplifier 99 includes a capacitive isolation barrier including capacitors 133 and 134. A voltage-to-duty-cycle converter circuit 95 similar to the one in FIGS. 4B-D produces duty-cycle-modulated output signals which are logical complements on conductors 131 and 132. These logical complement signals are applied to the left-hand terminals of isolation barrier capacitors 133 and 134, respectively. Reference numeral 96 designates a charge balanced duty-cycle-to-voltage demodulator having its logical complement inputs connected to the right-hand terminals of isolation barrier capacitors 133 and 134, respectively.

The analog input voltage signal $V_{IN}$ is applied to conductor 32. Conductor 32 is connected by means of input resistor 33 to conductor 34, which also is connected to the inverting input of operational amplifier 35, one terminal of feedback capacitor 38, to the drain electrode of P channel JFET 41A, and to constant current source 93. The output of operational amplifier 35 is connected by conductor 37 to the other terminal of capacitor 38, to the drain electrode of P channel JFET 44A, and to the inverting input of hysteresis comparator 46. (Hysteresis comparator 46 can be a conventional comparator with positive feedback, as shown in FIG. 5 by reference numerals 46, 118, and 119.) The output of hysteresis comparator 46 is connected by conductor 47 and feedback resistor 118 to its non-inverting input. The non-inverting input of hysteresis comparator 46 is also connected by resistor 119 either to modulated ground conductor 36, or optionally to a conductor 120 on which a noise synchronization signal $V_{NOISE}$ is applied. The output of hysteresis comparator 46 is connected to the non-inverting input of a differential comparator 130, the inverting input of which is connected to ground conductor 36. Differential comparator 130 produces logical complement duty-cycle encoded signals on conductors 131 and 132 for transmission across the above-mentioned isolation barrier capacitors 133 and 134 to conductors 170 and 172, respectively.

The source electrodes of JFETs 41A and 44A are connected by conductor 42 to "2I" constant reference current source 92. The gate electrode of JFET 41A is connected to the gate electrode of another P channel JFET 107 and to a conductor 101. Conductor 101 is connected to the non-inverted output of a differential comparator 121, the non-inverting input of which is connected by conductor 166 to one terminal of a capacitor 128 and to one terminal of resistor 123. The other terminal of resistor 123 is connected to modulator ground conductor 36.

Differential comparator 121 has an inverting input connected by conductor 167 to one terminal of capacitor 129 and to one terminal of resistor 126, the other terminal of which is connected to modulator ground conductor 36. A feedback resistor 125 is connected between conductor 167 and an inverted output of amplifier 121 by means of conductor 168. Conductor 168 is connected to the gate electrodes of JFET 44A and a P channel JFET 114. The source electrodes of JFETs 107 and 114 are connected by conductor 169 to "2I" constant current source 111.

The drain electrode of JFET 107 is connected to resistor 110, the other terminal of which is connected to modulator ground conductor 36.

The drain electrode of JFET 114 is connected by the parallel combination of resistor 115 and capacitor 116 to modulator ground conductor 36.

The right-hand terminal of isolation barrier capacitor 133 is connected by conductor 170 to the non-inverting input of differential comparator 137, to one terminal of resistor 139, and to one terminal of feedback resistor 140. The non-inverted output of differential comparator 137 is connected to the other terminal of resistor 140 and also is connected by conductor 171 to the gate electrode of P channel JFETs 147 and 148. The other terminal of resistor 139 is connected to demodulator ground conductor 5. The right-hand terminal of isolation barrier capacitor 134 is connected by conductor 172 to the inverting input of differential comparator 137, to one terminal of resistor 142, and to one terminal of resistor 141. The other terminal of resistor 141 is connected to demodulator ground conductor 5. The inverted output of differential comparator 137 is connected by conductor 173 to the other terminal of resistor 142 and the gate electrode of P channel JFETs 143 and 144.

The source electrodes of JFETs of 144 and 147 are connected by conductor 175 to "2I" constant current source 43A. The drain electrode of JFET 144 is connected by conductor 161 to one terminal of capacitor 151 and to the output of operational amplifier 153. Conductor 161 also is connected to the input of a sample and hold circuit 152 (which can be implemented by means of a sample and hold circuit such as one included in a Burr-Brown SHC5320). The sample control input of sample and hold circuit 152 is connected to one terminal of capacitor 149, the other terminal of which is connected to one terminal of resistor 150 and to the drain electrode of JFET 143. The other terminal of resistor 150 is connected to demodulator ground conductor 5.

The drain electrode of JFET 147 is connected to the other terminal of capacitor 151 and to the inverting input of operational amplifier 153. The non-inverting input of operational amplifier 153 is connected to demodulator ground conductor 5. The inverting input of operational amplifier 153 also is connected by conductor 176 to "I" constant current source 103 and to one terminal of resistor 158. The other terminal of resistor 158 is connected to conductor 164, on which an analog output voltage $V_{OUT}$ that is accurately representative of the analog input voltage $V_{IN}$ is produced.

The source electrode of JFETs 143 and 148 are connected to "2I" current source 146. The drain electrode of JFET 148 is connected to one terminal of resistor 156, the other terminal of which is connected to demodulator ground 5.

The output of sample and hold circuit 152 is connected by conductor 160 to the non-inverting input of an operational amplifier 178, the output of which is connected by conductor 164 to one terminal of feedback resistor 163. The other terminal of feedback resistor 163 is connected to the inverting input of operational amplifier 178 and to one terminal of resistor 162, the other terminal of which is connected to ground conductor 5.

Figure 10:
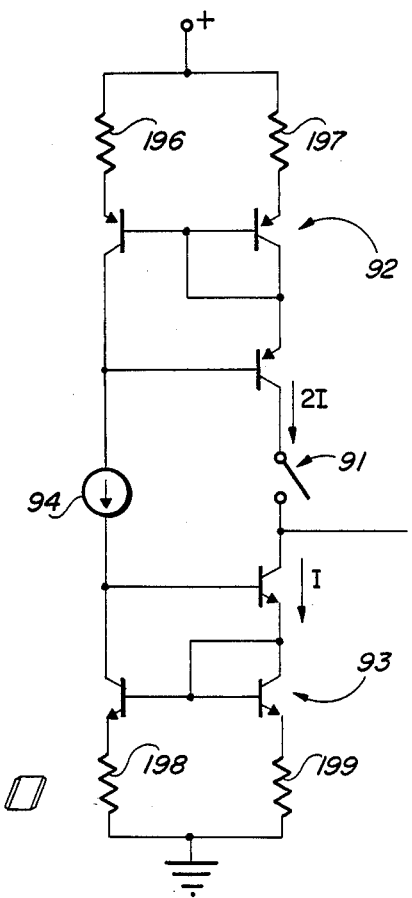
FIG. 10 is a diagram of a current source circuit that can be used in the circuits of FIGS. 1, 4A–D, and 5.

FIG. 10 shows a circuit which can be used to implement the various "2I" and "I" current sources in FIGS. 1, 4A–D, and 5. Numeral 94 designates a constant reference current, and resistors 196–199 are laser trimmable nichrome resistors that are used to adjust the currents 2I and I.

In operation, the analog input voltage $V_{IN}$ applied to conductor 32 produces the current $I_{IN}$ across input resistor 33 (the resistance of which is $R_{IN}$), since operational amplifier 35 maintains its inverting input at the voltage of modulator virtual ground 36. The amplitude of I is greater than the amplitude of $I_{IN}$. $I_{IN}$ is summed with either $+I$ or $-I$ in capacitor 38, depending upon whether the output conductor 37 of operational amplifier is ramping up or ramping down. The output of comparator 46 is produced on conductor 47 and is transmitted to differential input comparator 130, the inverted and non-inverted differential outputs of which are connected to conductors 132 and 131, respectively. The logical complement signals produced on conductors 131 and 132 are applied to inputs of two identical differential cells 190 and 191. Differential cell 190 is included in demodulator 96, and differential cell 191 is included in modulator 95. The complementary duty-cycle-modulated signals on conductors 131 and 132 therefore are precisely reproduced on conductors 101 and 168 in modulator 95, and identical replicas of the signals on conductors 131 and 132 also are produced on conductors 171 and 173 of demodulator 96.

In each of differential cells 190 and 191, the replicas of the duty-cycle-modulated signals on conductors 131 and 132 are utilized to switch in "2I" current sources 43A and 92, thereby turning transistor 41A on and 44A off, thereby switching "2I" current source 92 into conductor 34 if $I_{IN}$ is to be compared with the feedback current $+I$ (as in FIGS. 4B–D) to cause the output of operational amplifier 35 to "ramp down". When the negative threshold of the hysteresis comparator 46 is reached, the voltage on conductor 47 switches, reversing the polarity of the signals on the output conductors 131 and 132 of differential comparator 130, so now $I_{IN}$ is compared with $-I$, and the output of operational amplifier 35 "ramps up" until the positive threshold of hysteresis comparator 46 is reached.

Start-up circuit 188 simply ensures a DC current flow between conductors 167 and 47 when power is initially applied to modulator 95, thereby ensuring proper start-up thereof.

In the embodiment of the invention shown in FIG. 5, the isolation barrier capacitors 133 and 134, and also capacitors 128 and 129, all are equal to the small value of 1 picofarad. This small capacitance means that the voltage modulator ground 36 and the demodulator ground 5 can move very rapidly relative to each other (for example in response to line voltage pulses produced in response to static discharges) without affecting the transfer function of the isolation amplifier.

Since differential cells 191 and 190 are precisely matched, and since the P channel JFETs 147 and 144 precisely match P channel JFETs 41A and 44A, and the resistance $R_{IN}$ of input resistor 33 and the resistance $R_{OUT}$ of output resistor 158 are precisely matched, the switching operation of "2I" current source 43A and "I" current source 103 into node 176 are essentially identical to the switching of "2I" current source 92 and "I" current source 93 into node 34. JFETs 148 and 143 and resistor 150 produce a sample signal to sample and hold circuit 152 to cause appropriate sampling, as previously described with respect to FIGS. 1 and 2. This synchronizes the sampling period with the duty-cycle-modulated signal on conductors 131 and 132 to reduce the amount of ripple on conductor 160.

Figures 6, 8:
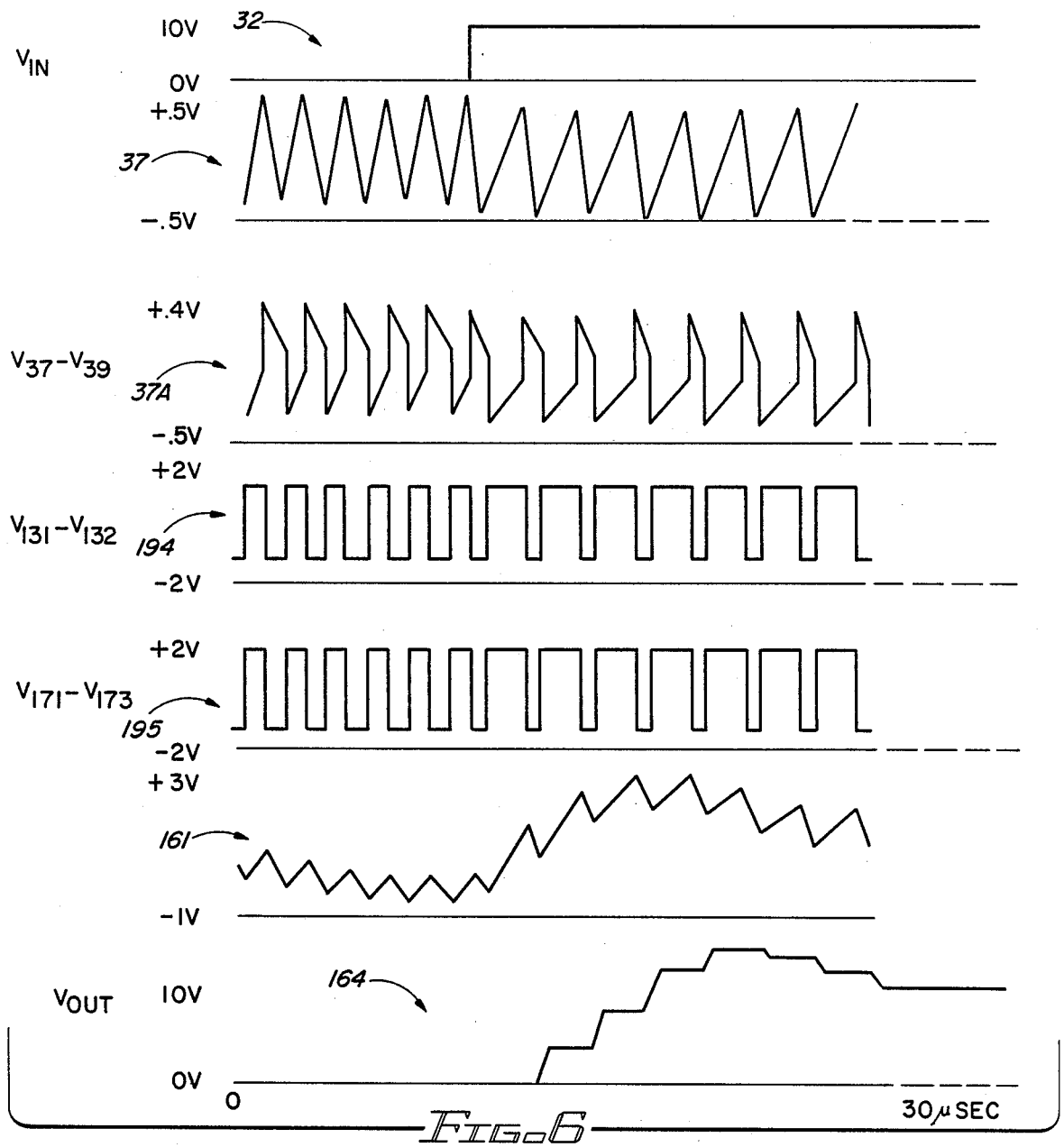
FIG. 6 is a timing diagram for the circuit of FIG. 5.
FIG. 8 is a timing diagram for the sample and hold circuit of FIG. 7.
Figure 7:
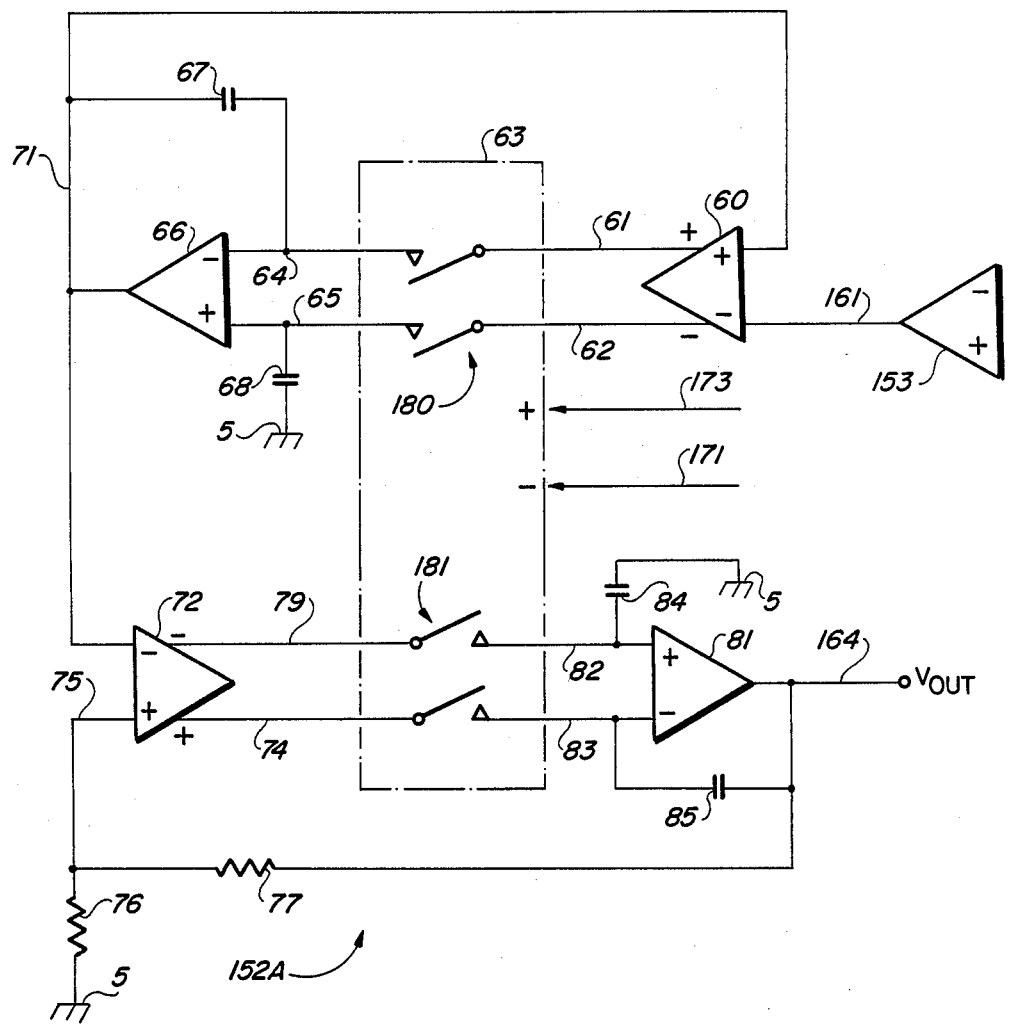
FIG. 7 is an improved "bucket brigade" sample and hold circuit which can be utilized in the circuit of FIG. 6.

Referring now to FIG. 6, $V_{IN}$ is the analog input signal waveform applied to conductor 32. The voltage produced by operational amplifier 35 on conductor 37 is indicated by waveform 37. Waveform 37A is equal to the difference between the voltages on hysteresis comparator inputs 37 and 39. The duty-cycle-modulated signal produced by modulator 95 is indicated by waveform 194, which is the difference between the voltages on isolation barrier input conductors 131 and 132. The input voltages $V_{171}$ and $V_{173}$ transmitted across the isolation barrier capacitor to conductors 171 and 173 of demodulator 96 is indicated by waveform 195, which shows the difference between $V_{171}$ and $V_{173}$.

The output of operational amplifier 153 of demodulator 96 is shown by waveform 161. The resulting value of $V_{OUT}$ produced on conductor 164 is shown by waveform 164. The waveforms of FIG. 6 were generated by simulating the circuit shown in FIG. 5 on the well-known circuit analysis program SPICE.

As indicated in FIG. 5, the lower end of resistor 119 can be connected to a noise synchronization conductor 120 instead of to modulator ground conductor 36. (It is well-known that beat frequencies, that is, sum and difference frequencies, may be created by the presence of noise at frequencies near a modulator carrier. The difference frequency components may "alias" back into the signal frequency spectrum.)

Figure 9:
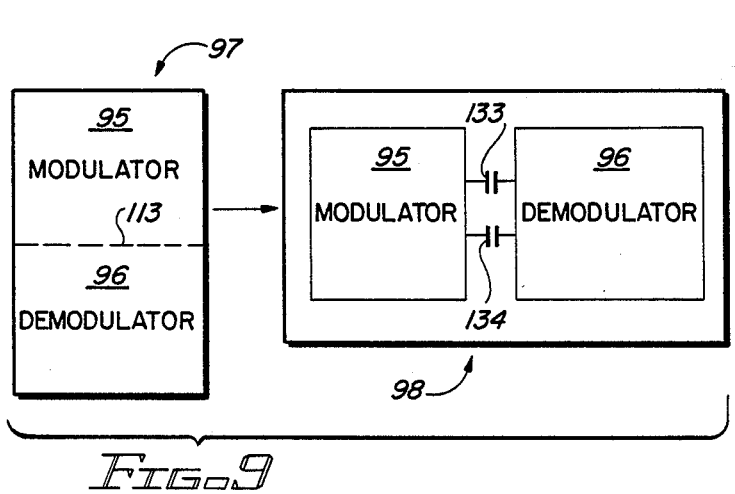
FIG. 9 is a diagram illustrating fabrication of the modulator and demodulator sections of an isolation amplifier on a single semiconductor chip, cutting the chip in half and packaging the separate modulator and demodulator chips in a package on opposite sides of an isolation barrier component.

In accordance with the present invention, and as shown in FIG. 9, modulator section 95 and demodulator section 96 are fabricated on a single semiconductor wafer, and preferably on adjacent chips in an area 97. The various nichrome resistors utilized for $R_{IN}$ and $R_{OUT}$ are precisely laser trimmed. The components of the two I-2I current switches and certain other components in the modulator and demodulator sections are sufficiently close together that they are precisely matched. After the laser trimming of the various nichrome resistors, including the current source resistors such as 196–199 of FIG. 10, the area 97 then is separated along dotted line 113 into two chips, one containing modulator 95 and the other containing demodulator 96. The two chips then are placed into a suitable package 98, with the output of modulator 95 and the input of demodulator 96 being connected to an isolation barrier including two capacitors 133 and 134. Alternately, the modulator chip 95 is located far from the demodulator chip 96, and the isolation barrier is a long optical fiber or the like.

In accordance with the present invention, if a known noise source $V_{NOISE}$ in a system is utilized to synchronize the operation of modulator circuit 95 with the noise source, then modulator 96 will not produce a beat frequency. This makes it necessary only to filter out the components of the output signal having a frequency equal to the carrier frequency; such filtering is accomplished by the demodulation. Thus, when there s a dominant noise frequency, such as power line noise, machinery noise, etc. the noise signal will be rejected if the modulator is synchronized to the noise frequency or to a subharmonic thereof. In the synchronized mode the carrier frequency is fixed and is no longer a function of the input voltage. Rejection of signals at integer multiples of the carrier is accomplished by the system's integration of the input over every cycle of the carrier. This is shown mathematically as follows. Assume $V_{IN}$ equals $A \cdot \text{cosine}(\omega_i t)$. Then $$V_{OUT} = \int_0^T V_{IN},$$

where T is equal to $2\pi/\omega_c$, $\omega_c$ being the carrier frequency. Therefore, $$V_{OUT} = \int_0^{2\pi/\omega_c} A \cdot \text{cosine}(\omega_i t) = -A \cdot [\text{sine}(0) - \text{sine}(\omega_i/\omega_c \cdot 2\pi)]$$

$$= A \, \text{sine}(2\pi \, \omega_i/\omega_c)$$

Therefore, $V_{OUT}$ equals 0 if $\omega_i$ equals $N \cdot \omega_c$, where N is an integer.

This means that if the input frequency $\omega_i$ is the harmonic of the carrier frequency $\omega_c$, that is, the modulator carrier is synchronized to a subharmonic of a noise signal. The signal will have an amplitude of zero.

As previously indicated, in many applications noise is generated by well-known external sources. Such noise signals may be larger than the signal level to be passed across tne isolation barrier of an isolation amplifier. However, such noise can be cancelled through "N-cycle integration". The ability to eliminate the resulting signal by synchronizing the modulator carrier frequency with such a noise signal makes it possible to avoid difficult, low frequency filtering which would also interfere with demodulation of the desired signal and reduce bandwidth of the isolation amplifier.

The sample and hold circuit 152 shown in FIG. 5 and also described in detail with reference to FIGS. 1 and 2 results in a substantial reduction in ripple voltage if the sample time can be a very small percentage of the sample cycle. In the isolation amplifier of FIG. 5, which is being designed to operate with bandwidth up to approximately 50 kHz, inherent circuit delays require that the sample time 24 in FIG. 2 be approximately one-tenth of the sample cycle. Consequently, the technique of utilizing a single sample and hold circuit 152 and the filter circuit 178 of FIG. 5 results in an unacceptably large amount of ripple. To overcome this, sample and hold circuit 152 and the circuit 178 of FIG. 5 are replaced by a "bucket brigade" sample and hold circuit 152A shown in FIG. 7. Bucket brigade sample and hold circuit 152A includes a first sample and hold circuit that includes operational amplifiers 60 and 66. The inverting input of oprational amplifier 60 is connected to conductor 161 of FIG. 5. The non-inverting input of amplifier 60 is connected to conductor 71, which is connected to the output of operational amplifier 66 and to one terminal of capacitor 67. The other input of operational amplifier 66 is connected to the inverting input thereof. The non-inverted output 61 of amplifier 60 is connected to one input of a switching circuit 63 which connects conductor 61 to the inverting input 64 of operational amplifier 66 when the first sample and hold circuit is sampling. Switching circuit 63 can be similar to a DG 183 manufactured by Siliconix, or a conventional diode bridge current steering circuit. The inverted output of amplifier 60 is connected by conductor 62 to an input of switching circuit 63 which couples conductor 62 to the non-inverting input 65 of operational amplifier 66 when the first sample and hold circuit is sampling. Capacitor 68 is connected between demodulator ground 5 and conductor 65. When the first sample and hold circuit is in its hold mode, the outputs of amplifier 60 are disconnected from the inputs of operational amplifier 66.

A second sample and hold circuit included in bucket brigade sample and hold circuit 152A includes amplifier 72 and operational amplifier 81. The inverting input of amplifier 72 is connected to conductor 71. The non-inverting input of amplifier 72 is connected by conductor 75 to one terminal of resistor 76, which is connected to demodulator ground conductor 5. Conductor 75 also is connected by resistor 77 to the output of operational amplifier 81 by conductor 164. The inverted output 79 of amplifier 72 is connected to one input of switching circuit 63, which switches the signal on conductor 71 to the non-inverting input 82 of operational amplifier 81. Conductor 82 is connected to one terminal of capacitor 84, the other terminal of which is connected to demodulator ground conductor 5. The inverted output of amplifier 72 is connected by conductor 74 to another input of switching circuit 63 which switches the signal on conductor 74 to the inverting input 83 of operational amplifier 81. Capacitor 85 is connected between the output and input of operational amplifier 81. The output of operational amplifier 81 is connected to output conductor 164.

The operation of bucket brigade sample and hold circuit 152A is simply that the logical complement signals on conductors 171 and 173 (i.e., the precise replicas of the complementary duty-cycle-modulated signals transmitted across tne isolation barrier capacitors 133 and 134) cause either of the above-mentioned sample and hold circuits contained in circuit 152A to be sampling while the other is holding, except during signal transitions. The switches contained in switching circuit 63 are of the type that are referred to as "break before make" switches. In other words, in switching circuit 63, switches 180 will break contact to cause the first sample and hold circuit 60, 66 to begin holding the input voltage on conductor 161 before the switches 181 make contact to acquire the value on conductor 71 and produce that value on output conductor 164. Similarly, when switches 181 are closed, so that the voltage on conductor 164 is sampling a voltage being held on conductor 71, switches 181 open before switches 180 close. Therefore, the sampling and holding operations of the two sample and hold circuits 60, 66 and 72, 81 overlap except during signal transitions.

In FIG. 8, waveform 171 designates the voltage on conductor 171, which controls switching circuit 63. Waveforms 71 and 164 designate the waveforms appearing on conductor 71 and $V_{OUT}$ conductor 164, respectively. During pulse 171A of waveform 171, the output of operational amplifier 153 produces a rising slope 161A on conductor 161. The first sampling and hold circuit 60, 66 thereby causes conductor 71 to track precisely with slope 161A, as designated by reference numeral 71A. When waveform 171 undergoes its transition to level 171B, the first sample and hold circuit holds the level of slope 71A, as indicated by 71B. Meanwhile, the second sample and hold circuit 72, 81, which was holding the previous value during pulse 171A, now samples the level 71B. This continues until the end of downward slope 161B, which is reversed to produce slope 161C when waveform 171 goes from level 171B to 171C. This causes the first sample and hold amplifier 60, 66 to now begin tracking the voltage at the lowest portion of slope 161B. Meanwhile, the second sample and hold circuit 72, 81 continues to hold the level 71B on conductor 164. During pulse 171C, waveform 71 tracks with slope 161C, producing slope 71C. Thus, the $V_{OUT}$ waveform 164 has essentially no ripple voltage thereon.

The combined isolation amplifier including the circuit of FIG. 5 with sample and hold circuit 152 and filter 178 replaced by bucket brigade sample and hold circuit 152A provides very high performance isolation amplifier that has essentially no ripple voltage, and yet has high bandwidth. The small value (1 picofarad) isolation barrier capacitors are very inexpensive, and allow extremely rapid transitions of the modulated ground 36 and the demodulated ground 5 without affecting the transfer characteristic of the isolation amplifier.

The carrier frequency of the described system can be changed by merely changing the value of the integrator capacitor, which can be a great convenience. The described invention provides an inexpensive system that operates with low "input offset" errors in the vicinity of the 50% modulation level of the carrier (which represents an analog input voltage $V_{IN}$ equal to zero volts) because the input offset is determined primarily by the digital signal integrity and the precise matching of current sources on opposite sides of the isolation barrier. The accuracy of the demodulator is relatively independent of inaccuracies in the sample and hold circuit. The accuracy of the modulation is substantially independent on the linearity of any external synchronization source.

While the invention has been described with reference to a particular embodiment thereof, those skilled in the art will be able to make various modifications to the described embodiment of the invention without departing from the true spirit and scope thereof. It is intended that all elements and steps which perform substantially the same function in substantially the same manner to achieve the same result are within the scope of the invention. For example, modulator-demodulator systems other tnan isolation amplifiers are within the scope of the invention. The ratio of the "2I" and "I" current sources can be other than two.

We claim:
1. A modulator/demodulator circuit comprising in combination:
  (a) a modulator circuit including
    i. means for receiving an analog input current;
    ii. first switching means for producing a first current that is switched between positive and negative values in response to a signal on a first conductor;
    iii. first integrating circuit means for integrating an algebraic sum of the analog input current and the first current to produce an output voltage that increases or decreases in accordance with whether the algebraic sum of the input current and the first current is positive or negative;
    iv. means for producing a duty-cycle modulated signal on the first conductor having a first level if the output voltage exceeds a reference voltage signal that is synchronized with a noise signal;
  (b) means for coupling the first conductor second conductor; and
  (c) a demodulator including
    i. second switching means for producing a second current that is switched between positive and negative levels in response to the duty cycle modulated signal on the second conductor;
    ii. second integrating means for integrating the second current to produce an analog output signal that is accurately representative of the analog input current.

2. An isolation amplifier comprising in combination:
  (a) a modulator circuit including
    i. means for producing an analog input current in response to an analog input voltage;
    ii. first current switching means for producing a first current that is switched between positive and negative values in response to a signal on a first conductor;

iii. first integrating circuit means for integrating an algebraic sum of the analog input current and the first current to produce an output voltage that increases or decreases in accordance with whether the algebraic sum of the analog input current and the first current is positive or negative;

iv. means for producing a duty-cycle-modulated digital signal on the first conductor having a first level if the output voltage of the first integrating circuit means exceeds a threshold voltage and a second level if the output voltage of the first integrating circuit means is less than another threshold voltage;

(b) a non-galvanic isolation barrier having an input coupled to the first conductor and an output coupled to a second conductor; and (c) a demodulator including
 i. second current switching means for producing a second current that is switched between positive and negative levels in response to the duty cycle modulated digital signal on the second conductor;
 ii. second integrating circuit means for integrating the second current to produce an analog output voltage that is accurately representative of the analog input voltage, wherein the second integrating circuit means includes
  a first operational amplifier having a first input responsive to the second current,
  a second input coupled to a demodulator ground reference voltage,
  a first capacitor having a first terminal coupled to the first input of the first operational amplifier and a second terminal connected to an output of the second operational amplifier,
  a sample and hold circuit having an analog input coupled to the output of the first operational amplifier, an analog output conductor coupled to a first terminal of an output resistor, a second terminal of the output resistor being connected to the first input of the first operational amplifier, the analog output voltage being produced on the analog output conductor of the sample and hold circuit, the sample and hold circuit including a sample control input coupled to the second conductor.

3. The isolation amplifier of claim 2 wherein the first integrating circuit means includes a second operational amplifier having a first input receiving the analog input current and connected to a first terminal of a second capacitor, a second terminal of the second capacitor being connected to an output of the second operational amplifier.

4. The isolation amplifier of claim 3 wherein the duty-cycle-modulated signal producing means includes a comparator having an output coupled to the first conductor, a first input coupled to the output of the second operational amplifier, and a second input receiving a reference voltage.

5. The isolation amplifier of claim 4 wherein the comparator is a hysteresis comparator.

6. The isolation amplifier of claim 5 wherein the reference voltage is a ground reference voltage.

7. The isolation amplifier of claim 5 wherein the reference voltage is synchronized to a periodic noise signal, the comparator responding to the reference signal to synchronize a carrier frequency of the modulator to the periodic noise signal to prevent the modulator from producing a low frequency beat signal.

8. The isolation amplifier of claim 4 wherein the reference voltage is a ground reference voltage.

9. The isolation amplifier of claim 4 wherein the first current switching means includes a first constant current source coupled to a first summing node, a second constant current source producing a substantially different current than the first constant current source, and means responsive to the duty-cycle-modulated digital signal for steering the current produced by the second constant current source to the first summing node to produce a value of the first current equal to the difference between the currents produced by the first and second constant current sources in response to a particular level of the duty-cycle-modulate digital signal.

10. The isolation amplifier of claim 9 including a second current switching means that includes a third constant current source coupled to a second summing node, a fourth constant current source producing a substantially different current than the third constant current source, and means responsive to the duty-cycle-modulated signal on the second conductor for steering the current produced by the fourth constant current source to the second summing node to produce value of the second current equal to the difference between the currents produced by the third and fourth constant current sources in response to the particular level of the duty-cycle-modulated digital signal.

11. The isolation amplifier of claim 10 wherein the ratio of the constant currents produced by the first and second constant current sources is equal to the ratio of the constant currents produced by the third and fourth constant current sources.

12. The isolation amplifier of claim 9 wherein the sample and hold circuit is a bucket brigade sample and hold circuit.

13. The isolation amplifier of claim 12 wherein the bucket brigade sample and hold circuit includes:
(a) a first sample and hold circuit including
 i. a third operational amplifier having a first input receiving an analog input signal, and a first output,
 ii. a fourth operational amplifier having a first input and an output,
 iii. first switching means for coupling the first output of the third operational amplifier to the first input of the fourth operational amplifier in response to a first sample control signal; and
(b) a second sample and hold circuit including
 i. a fifth operational amplifier having a first input coupled to the output of the fourth operational amplifier, and a first output,
 ii. a sixth operational amplifier having a first input and an output;
 iii. second switching means for coupling the first output of the fifth operational amplifier to the first input of the sixth operational amplifier in response to the first sample control signal.

14. The isolation amplifier of claim 13 wherein the bucket brigade sample and hold circuit includes means repsonsive to a first level of the first sample control signal for repeatedly performing the sequence of operations including (1) causing the first switching means to couple the first output of the third operational amplifier to the first input of the fourth operational amplifier to cause the analog input signal to be acquired by the forth operational amplifier and held on the output of the fourth operational amplifier, (2) causing the first switching means to then decouple the first output of the third operational amplifier from the first input of the fourth operational amplifier in response to a second level of the first sample control signal so that a first value of the analog input signal that is acquired immediately before the decoupling is held on the output of the fourth operational amplifier and the first input of the fifth operational amplifier, (3) causing the second switching means to couple the first output of the fifth operational amplifier to the first input of the sixth operational amplifier to cause the first value to be acquired by the sixth operational amplifier and held on the output of the sixth operational amplifier during the second level.

15. A method of operating a modulator/demodulator circuit comprising the steps of:
   (a) producing an analog input current;
   (b) switching a firsat current between positive and negative values in response to a signal on a first conductor;
   (c) integrating an algebraic sum of the analog input current and the first current to produce an output signal that increases or decreases in accordance with whether the algebraic sum of the input current and the first current is positive or negative;
   (d) producing a duty-cycle-modulated digital signal on the first conductor having a first level if the output signal exceeds a first threshold signal and a second level if the difference is less than a second threshold signal;
   (e) switching a second current between positive and negative levels in response to the duty=cycle-modulated digital signal;
   (f) integrating the second current to produce an analog output signal that is accurately representative of the analog input current by
      i. applying the second current to a first input of a first operational amplifier having a second input coupled to a demodulator ground reference voltage, a first capacitor having one terminal coupled to the first input of the first operational amplifier and a second terminal coupled to an output of the first operational amplifier,
      ii. applying a signal on the output of the first operational amplifier to an analog input fo a sample and hold circuit, an analog output conductor of the sample and hold circuit being coupled to a first terminal of an output resistor, a second terminal of the output resistor being coupled to the first input of the first operational amplifier, and
      iii. applying the signal on the second conductor to a sample control input of the sample and hold circuit, the analog output voltage being produced on the analog output conductor of the sample and hold circuit.

16. The method of claim 15 wherein step (d) includes comparing the output signal to the first and second threshold signals by means of a comparator circuit.

17. The method of claim 16 including applying the output signal to a first input of the comnparator circuit and applying a periodic noise signal to a second input of the comparator circuit, the method including operating the comparator to synchronize a carrier frequency of the moduylator to the periodic noise signal to avoid producing a low frequency beat signal.

18. A method of making an isloation amplifier, comprising the steps of:
   (a) forming a modulator circuit in a first rectangular area on a semiconductor wafer and simultaneously forming a demodulator circuit in a second rectangular area of the wafer, one of the modulator and demodulator circuits including laser trimmable resistors for adjusting a first switchable current source circuit supplying a first switched current to an integrating circuit of that modulator or demodulator circuit, the other of the modulator and demodulator circuits having a second switchable current source circuit supplying a second switched current to an integrating curcuit in that other modulator or demodulator circuit;
   (b) laser trimming the resistor to cause the first and second switched currents to be precisely matched;
   (c) separating the first and second areas from the wafer to form a modulator chip and a demodulator chip;
   (d) coupling an output of the modulator chip to an input of the demodulator chip,
   whereby the precise matching of the first and second switched currents results in acccurate demodulation of a modulated signal received by the demodulator chip from the modulator chip.

19. A duty cycle modulator circuit comprising in combination:
   (a) means for receiving an analog input current;
   (b) first switching means for producing a first current that is switched between positive and negative values in response to a signal on a first conductor;
   (c) first integrating circuit means for integrating an algebraic sum of the analog input current and the first current to produce an output voltage that increases or decreases in accordance with whether the algebraic sum of the analog input current and the first current is positive or negative;
   (d) means for producing a duty-cycle-modulated signal on the first conductor having a first level if the output voltage exceeds a reference voltage signal that is synchronized with a noise signal, whereby no low frequency beat signal is produced.

20. The duty cycle modulator circuit of claim 19 including means for producing the analog input current in response to an analog input voltage.

21. The duty cycle modulator circuit of claim 20 wherein the analog input current producing means includes a first resistor having one terminal receiving the analog input voltage and another terminal coupled to a first summing node.

22. The duty cycle modulator circuit of claim 21 wherein the first integrating means includes a first operational amplifier having a first input coupled to the first summing node and a first terminal of a first capacitor, a second terminal of the first capacitor being connected to an output of the first operational amplifier, a second input of the operational amplifier being coupled to a first reference voltage conductor.

23. The duty cycle modulator circuit of claim 22 wherein the duty-cycle-modulated signal producing means includes a comparator having a first input coupled to the output of the first operational amplifier, a second input coupled to receive the reference voltage signal, and an output coupled to the first conductor.

24. A demodulator circuit comprising in combination:
(a) first circuit means for receiving a digital input signal that is modulated to represent an analog input signal and producing in response thereto a switch control signal including a sequence of pulses;
(b) a first current source;
(c) switching means for electrically coupling the first current source to a first summing node during the pulses of the switch control signal;
(d) integrating circuit means having a first input coupled to the first summing node and an output for integrating a current flowing from the first summing node to the first input;
(e) a sample and hold circuit having an input coupled to the output of the integrating circuit means and an output, and a sample control input responsive to the digital input signal, wherein the sample and hold circuit includes
  i. a first sample and hold circuit having an input coupled to the output of the intergrating circuit means, and
  ii. a second sample and hold circuit having an input coupled to an output of the first sample and hold circuit, the second sample and hold circuit having an output producing the analog output signal;
(f) a feedback resistor coupled between the output of the sample and hold circuit and the first summing node, the output of the sample and hold circuit means producing an analog output signal that accurately represents the analog input signal, the sample and hold circuit operating to substantially reduce ripple voltage on the analog output signal.

25. The demodulator circuit of claim 24 wherein the integrating circuit means inlcudes an operational amplifier having a first input coupled to the first summing node and a second input receiving a reference voltage, and an output coupled to the output of the integrating circuit means, and a capacitor coupled between the first input and the output of the operational amplifier.

26. The demodulator circuit of claim 24 wherein the first sample and hold circuit inlcudes
(i) a first operational amplifier having a first input receiving an analog input signal, and a first output,
(ii) a second operational amplifier having a first input and an output, and
(iii) first switching means for coupling the first output of the first operational amplifier to the first input of the second operational amplifier in response to a first sample control signal,
and wherein the second sample and hold circuit includes
(i) a third operational amplifier having a first input coupled to the output of the sample operational amplifier, and a first output,
(ii) a fourth operatioanl amplifier having a first input and an output, and
(iii) second switching means for coupling the first output of the third operational amplifier to the first input of the fourth operational amplifier in response to the first sample control signal.

27. The duty cycle demodulator of claim 26 wherein the sample and hold circuit includes means responsive to a first level of the first sample control signal for repeatedly performing a sequence of operations including
(1) causing the first switching means to couple the first output of the first operational amplifier to the first input of the second operational amplifier to cause the analog input signal to be held on the output of the second operational amplifier,
(2) causing the first switching means to then decouple the first output of the first operational amplifier from the first input of the second operational amplifier in response to a second level of the first sample control signal so that a first value of the analog input signal that is acquired immediately before the decoupling is held on the output of the second operational amplifier and the first input of the third operational amplifier,
(3) causing the second switching means to couple the first output of the third operational amplifier to the first input of the fourth operational amplifier to cause the first value to be acquired and held on the output of the fourth operational amlifier during the second level.

28. A sample and hold circuit comprising in combination:
(a) a first sample and hold circuit including
  i. a first operational amplifier having a first input receiving an analog input signal, and a first output,
  ii. a second operational amplifier having a first input and an output,
(b) a second sample and hold circuit including
  i. a third operational amplifier having a first input coupled to the output of the second operational amplifier, and a first output,
  ii. a fourth operational amplifier having a first input and an output,
(c) first switching means for coupling the first output of the first operational amplifier to the first input of the second operational amplifier throughout a first interval, and then decoupling the first output of the first operational amplifier from the first input of the second operational amplifier at the end of the first interval;
(d) second switching means for coupling the first output of the third operational amplifier to the first input of the fourth operational amplifier throughout a second interval that begins after the decoupling.

29. The sample and hold circuit of claim 28 including means responsive to a first level of a first sample control signal for repeatedly performing the sequence of operations including
(1) causing the first switching means to couple the first output of the first operational amplifier to the first input of the second operational amplifier during the first interval to cause the analog input signal to be acquired and held on the output of the second operational amplifier in response to a first level of the first sample control signal,
(2) causing the first switching means to then decouple the first output of the first operatioanl amplifier from the first input of the second operatioanal amplifier in response to a second level of the first sample control signal so that a first value of the analog input signal that is acquired immediately before the decoupling is held on the output of the second operational amplifier nd the first input of the third operational amplifier,
(3) causing the second switching means to couple the first output of the third operational amplifier to the first input of the fourth operational amplifier during the second interval to cause the first value to be acquired and held on the output of the fourth operational amplifier during the second interval.

30. The sample and hold circuit of claim 29 wherein the first operational amplifier includes a second input and a second output coupled by the first switching means to a second input of the second operational amplifier and the third operational amplifier has a second input and a second output coupled by the second switching means to a second input of the fourth operational amplifier.

31. A method of performing a sample and hold operationa on an analog input signal, comprising the steps of:
(a) operating a first switching means to couple a first output of a first operational amplifier to a first input of a second operational amplifier throughout a first interval to cause the analog input signal to be acquired and held on an output of the second operational amplifier in response to a first level of a first sample control signal;
(b) operating the first switching means to then decouple the first output of the first operational amplifier from the first input of the second operational amplifier in response to a second level of the first sample control signal so that a first value of the analog input signal that is acquired immediately before the decoupling is held on the output of the second operational amplifier and the first input of a third operational amplifier;
(c) operating a second switching means to couple a first output of the third operational amplifier throughout a second interval that begins after the decoupling to a first input of a fourth operational amplifier to cause the first value to be acquired and held on an output of the fourth operational amplifier during the second interval.

32. The method of claim 31 including repeating steps (a) through (c) for successive first and successive levels of the first sample control signal, whereby essentially no ripple voltage is produced on the output of the fourth operational amplifier.

33. A modulator/demodulator circuit comprising in combination:
(a) a modulator circuit including
  i. means for receiving an analog input current;
  ii. first switching means for producing a first current that is switched between positive and negative values in response to a signal on a first conductor;
  iii. first integrating circuit means for integrating an algebraic sum of the analog input current and the first current to produce an output voltage that increases or decreases in accordance with whether the algebraic sum of the input current and the first current is positive or negative;
  iv. means for producing a duty cycle modulated signal on the first conductor having a first level if the output voltage exceeds a threshold voltage and a second level if the output voltage is less than another threshold voltage;
(b) means for coupling the first conductor to a second conductor; and
(c) a demodulator including
  i. second switching means for producing a second current that is switched between positive and negative levels in responsie to the duty cycle modulated signal on the second conductor;
  ii. second integrating means for integrating the second current to produce an analog output signal that is accurately representative of the analog input current, wherein the second integrating circuit means includes
    a first operational amplifier having a first input responsive to the second current,
    a second input coupled to a demodulator ground reference voltage,
    a first capacitor having a first terminal coupled to the first input of the first operational amplifier and a second terminal connected to an output of the first operational amplifier,
    a sample and hold circuit having an analog input coupled to the output of the first operational amplifier, an analog output conductor coupled to a first terminal of an output resistor, a second terminal of the output resistor being connected to the first input of the first operational amplifier, the analog output voltage being produced on the analog output conductor of the sample and hold circuit, the sample and hold circuit including a sample control input coupled to the second conductor.

34. An isolation amplifier comprising in combination:
(a) a modulator circuit including
  i. means for producing an analog input current in response to an analog input voltage;
  ii. first current switching means for producing a first current that is switched between positive and negative values in response to a signal on a first conductor;
  iii. first integrating circuit means for integrating an algebraic sum of the analog input current and the first current to produce an output voltage that increases or decreases in accordance with whether the algebraic sum of the analog input current and the first current is positive or negative;
  iv. means for producing a duty-cycle-modulated digital signal on the first conductor having a first level if the output voltage of the first integrating circuit means exceeds a threshold voltage and a second level if the output voltage of the first integrating circuit means is less than another threshold voltage, wherein the first integrating circuit means includes a first operational amplifier having a first input receiving the analog input current and connected to a first terminal of a first capacitor, a second terminal of the first capacitor being connected to an output of the first operational amplifier, wherein the threshold voltage is synchronized to a periodic noise signal, the comparator responding to the threshold voltage to synchronize a carrier frequency of the modulator to the periodic noise signal to prevent the modulator from producing a low frequency beat signal;
(b) a non-galvanic isolation barrier having an input coupled to the first conductor and an output coupled to a second conductor; and
(c) a demodulator including
  i. second switching means for producing a second current that is switched between positive and negative levels in response to the duty cycle modulated digital signal on the second conductor;

ii. second integrating circuit means for integrating the second current to produce an analog output voltage that is accurately representative of the analog input voltage.

35. A method of operating a modulator/demodulator circuit comprising the steps of:
   (a) producing an analog input current;
   (b) switching a first current between positive and negative values in response to a signal on a first conductor;
   (c) integrating an algebraic sum of the analog input current and the first current to produce an output signal that increases or decreases in accordance with whether the algebraic sum of the input current and the first current is positive or negative;
   (d) producing a duty-cycle-modulated digital signal on the first conductor having a first level if the output signal exceeds a first threshold signal and a second level if the difference is less than a second threshold signal by applying the output signal to a first input of a comparator circuit and applying a periodic noise signal to a second input of the comparator circuit, and operating the comparator circuit to synchronize a carrier frequency of the modulator to the periodic noise signal to avoid producing a low frequency beat signal;
   (e) switching a second current between positive and negative levels in reponse to the duty-cycle-modulated digital signal; and
   (f) integrating the second current to produce an analog output signal that is accurately representative of the analog input current.

36. A method of making an isolation amplifier, comprising the steps of:
   (a) forming a modulator circuit in a first area on a semiconductor wafer and simutaneously forming a demodulator circuit in a second area of the wafer;
   (b) separating the first and second areas from the wafer to form a modulator chip and a demodulator chip;
   (c) coupling an output of the modulator chip to an input of the demodulator chip, whereby resulting precise matching of component parameters in the modulator circuit and the demodulator circuit results in accurate demodulation of a modulated signal received by the demodulator chip from the modulator chip.

37. A demodulator circuit comprising in combination:
   (a) first circuit means for receiving a digital input signal that is modulated to represent an analog input signal and producing in response thereto a switch control signal inlcuding a sequence of pulses;
   (b) a first current source;
   (c) a second current source connected to a first summing node, the second current source producing a current that is substantially different than the current produced by the first current source;
   (d) switching means for electrically coupling the first current source to the first summing node during the pulses of the switch control signal;
   (e) integrating circuit means having a first input coupled to the first summing node and an output for integrating a current flowing from the first summing node to the first input;
   (f) a sample and hold circuit having an input coupled to the output of the integrating circuit means and an output, and a sample control input responsive to the digital input signal;
   (g) a feedback resistor coupled between the output of the sample and hold circuit and the first summing node, the output of the sample and hold circuit means producing an analog output signal that accurately represents the analog input signal, the sample and hold circuit operating to substantially reduce ripple voltage on the analog output signal.

38. The demodulator circuit of claim 37 wherein the current produced by the first current sources is twice the current produced by the second current source, whereby the integrating circuit means integrates the algebraic sum of a feedback current in the feedback resistor and a first current that is switched between values of plus or minus the value of the current produced by the second current source.

* * * * *